United States Patent
Simons et al.

(10) Patent No.: US 7,205,741 B2
(45) Date of Patent: Apr. 17, 2007

(54) PLANAR MOTOR INITIALIZATION METHOD, PLANAR MOTOR, LITHOGRAPHIC APPARATUS AND DEVICE MANUFACTURING METHOD

(75) Inventors: Wilhelmus Franciscus Johannes Simons, Beesel (NL); Henrikus Herman Marie Cox, Eindhoven (NL); Sven Antoin Johan Hol, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 491 days.

(21) Appl. No.: 10/874,691

(22) Filed: Jun. 24, 2004

(65) Prior Publication Data

US 2005/0285550 A1   Dec. 29, 2005

(51) Int. Cl.
*G05B 11/01* (2006.01)
(52) U.S. Cl. ............... 318/560; 318/640; 318/649; 414/935
(58) Field of Classification Search ................ 318/560, 318/566, 640, 649, 671; 414/935
See application file for complete search history.

(56) References Cited

U.S. PATENT DOCUMENTS 6,373,153 B1 * 4/2002 Hazelton et al. ............... 310/12
6,580,260 B2 * 6/2003 Takita .......................... 323/299
6,969,966 B2 * 11/2005 Ebihara et al. ............. 318/649
2002/0079464 A1 * 6/2002 Driessen et al. .......... 250/492.1
2002/0153868 A1 * 10/2002 Takita .......................... 323/282

* cited by examiner

*Primary Examiner*—Rina Duda
(74) *Attorney, Agent, or Firm*—Pillsbury Winthrop Shaw Pittman LLP

(57) ABSTRACT

A planar motor is controlled by supplying a three-phase alternating current to a coil assembly. Each phase is supplied to one of three coils. The coils are positioned in a magnetic field generated by a magnet plate having alternating magnet poles at its surface for generating an alternating magnetic field. In operation, the phase of each current flowing through each coil determines the direction of a force generated due to the current in the magnetic field. For correct operation, the phase angle of each current is to be adapted to the local direction of the magnetic field by determining a commutation-offset angle. The commutation-offset angle is determined by generating a force in an unknown direction and varying the commutation-angle, and determining when the generated force is directed perpendicular to the magnet plate, while ensuring that the generated force does not exceed a horizontal friction force. By determining a maximum compression of end stops of the coil assembly, or determining a maximum pressure, it may be determined when the generated force is directed perpendicular to the magnet plate.

10 Claims, 3 Drawing Sheets

PLANAR MOTOR INITIALIZATION METHOD, PLANAR MOTOR, LITHOGRAPHIC APPARATUS AND DEVICE MANUFACTURING METHOD

BACKGROUND OF THE INVENTION

1. Field of the Invention

The present invention relates to a planar motor initialization method, a planar motor, a lithographic apparatus, and a device manufacturing method.

2. Description of the Related Art

A lithographic apparatus is a machine that applies a desired pattern onto a target portion of a substrate. Lithographic apparatus can be used, for example, in the manufacture of integrated circuits (ICs). In that circumstance, a lithographic patterning device, which is alternatively referred to as a "mask" or "reticle", may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (i.e., resist).

In general, a single substrate will contain a network of adjacent target portions that are successively exposed. Known lithographic apparatus include so-called steppers, in which each target portion is irradiated by exposing an entire pattern onto the target portion in one go, while in so-called scanners, each target portion is irradiated by scanning the pattern through the projection beam in a given direction (the "scanning"-direction) while synchronously scanning the substrate parallel or anti-parallel to this direction.

The substrate and the patterning device are being moved and transferred into, and inside and out of, the lithographic apparatus. A planar motor may be employed for one or more transfers and moves of the substrate and/or the patterning device.

A planar motor comprises a magnet plate and a coil assembly. The magnet plate is a two dimensional array of magnets having alternating magnet poles. The coil assembly comprises a plurality of coils, preferably three coils. These coils are elongated coils, the separate coils may be positioned parallel to each other. The coil assembly is positioned over the alternating magnet poles of the magnet plate.

The planar motor may be provided with a control system for providing a current to the coils. The current is an alternating current, preferably a two-phase or three-phase alternating current. When current flows through the coils positioned in a magnetic field, a force is generated which force is exerted on the coil assembly relative to the magnet plate. A direction of the force depends on the direction of the current through the coils and on the relative position of the coils with respect to the magnetic field.

Hereinafter, it is presumed that the magnet plate is mounted and attached to a frame, for example, a frame of the lithographic apparatus and thus functions as a stator of the planar motor, and the coil assembly may move relative to the magnet plate. This, however, is not essential and it may be that the coil assembly functions as a stator and the magnet plate may move, or both may move relative to each other.

Assuming a magnet plate extending in the horizontal plane, during operation, a vertical force may be generated in order to generate a gap between the coil assembly and the magnet plate. Thus, the coil assembly may levitate above the magnet plate. Further, a horizontal force may be generated in order to move the coil assembly horizontally relative to the magnet plate. If both forces are generated simultaneously, the coil assembly may be controlled to move in a plane parallel to the magnet plate with only little friction.

In rest, i.e. not in operation, there may be no vertical force and the coil assembly is positioned on the magnet plate. To start the planar motor, the motor needs to be initialized. Since the direction of a generated force depends on the direction of the current and on the relative position of the coil assembly and the magnetic field, this relative position should be determined in order to control the coil assembly correctly.

It is known to provide the coil assembly with hall sensors to determine the relative position of the magnetic field at the coil assembly directly. Further, it is known to provide a position determination system for determining the position of the coil assembly with respect to the magnet plate directly. Both known methods disadvantageously require additional electronic elements, which are sensitive to malfunctioning, require additional circuitry and add additional weight.

SUMMARY OF THE INVENTION

The principles of the present invention, as embodied and broadly described herein, provide an initialization method for initializing a planar motor without requiring additional determination systems. The initialization method relies on the notion that the direction of the resulting force generated by the coil assembly, when provided with a three-phase current supply, depends on the phase angle applied. When the relationship between the direction of the resulting force and the phase angle is determined, the position of the coil assembly with respect to the magnet plate can be derived. From this relationship, the appropriate commutation offset angle, required during movement of the coil assembly parallel to the magnet plate, may be derived.

In one embodiment, an initialization method for determining a commutation offset angle for a planar motor. The planar motor comprises at least one coil assembly provided with a plurality of coils and a magnet plate provided with a plurality of magnets. The initialization method comprises supplying a control current to the coils of the at least one coil assembly; varying a commutation angle of the control current; determining a displacement of the coil assembly relative to the magnet plate as a function of the commutation angle; selecting the commutation angle resulting in a maximum or a minimum displacement; and determining the commutation offset angle based on the selected commutation angle.

When the initialization method is performed, the planar motor is at rest and the coil assembly is positioned on the magnet plate. To prevent damage to the magnet plate and/or coil assembly, the coil assembly is provided with end stops, which end stops may be compressible. A stiffness of the end stops determines the compression of the end stops with respect to the exerted force.

In rest, the end stops are compressed due to gravity on the coil assembly. When another vertical force is exerted on the coil assembly, the end stops may be further compressed or be less compressed, depending on the direction of the other force, downwards or upwards, respectively. In both cases, the coil assembly is vertically displaced with respect to the magnet plate.

In the method according to the present invention, the coils of the coil assembly are provided with a current, thereby generating a force. However, since the position of the coils with respect to the magnetic field is unknown at that time, the direction of the generated force is unknown.

By varying the commutation angle of the current, the direction of the force changes. Thus, depending on the direction of the generated force, a vertical displacement of the coil assembly may result due to a vertical component of the force. Virtually no vertical displacement is generated, when the force is directed substantially in the horizontal direction (i.e. the vertical displacement is at its minimum). A maximum vertical displacement is generated when the force is directed substantially in vertical direction.

It is noted that the strength of the generated force is preferably predetermined in order not to exceed a horizontal friction force between the end stops of the coil assembly and the magnet plate to prevent that the coil assembly will horizontally move when the generated force is horizontal.

When the vertical displacement is at a maximum value, the corresponding commutation angle determines the commutation offset angle, since the commutation angle resulting in a maximum vertical direction and the commutation offset angle have an unambiguous relation. It is preferred to use the maximum vertical displacement (i.e. perpendicular to the magnet plate) to determine the commutation angle, since the determined commutation angle is in that case equal to the commutation offset angle for operating the planar motor. However, it should be noted that the required commutation offset angle may also be derived from the commutation angle corresponding to the minimum vertical displacement since the commutation angle corresponding to the minimum vertical displacement equals the commutation angle corresponding to the maximum vertical displacement + or −90 degrees.

Preferably, after determining the commutation offset angle according to the method described above wherein the generated force not exceeds a predetermined horizontal friction force, the method is extended by increasing the generated force gradually or instantaneously to a value exceeding the friction force using the determined commutation offset angle. Thereafter the commutation angle may be varied within a predetermined range for determining the commutation offset angle with a high accuracy.

Since a commutation angle for generating a substantially vertical force is determined, the generated force may be increased without the possibility that the coil assembly will move horizontally as long as the variation in the commutation angle is kept within a predetermined range. Using a greater force, the absolute value of the displacement in vertical direction is larger, and thus the commutation angle resulting in a maximum displacement may be determined with a higher accuracy.

In another embodiment, the present invention provides a planar motor system comprising a planar motor comprising at least one coil assembly provided with a plurality of coils and a magnet plate provided with a plurality of magnets; and a control system that controls a current supplied to the coils of the coil assembly. The control system is configured to supply a control current, to vary a commutation angle of the control current, to determine a displacement of the coil assembly as a function of the commutation angle, and to select the commutation angle resulting in a maximum displacement as the commutation offset angle for operation of the planar motor.

Preferably, the planar motor according to the present invention is provided with at least one distance sensor operatively coupled to the control system for determining an absolute distance between the coil assembly and the magnet plate. Thus, a direct measurement may determine a first absolute distance. Then, after changing the commutation angle and determining a second absolute distance, a difference value between the first distance and the second distance indicates the displacement in a vertical direction due to the commutation angle change.

If the commutation angle is determined by determining a maximum vertical displacement towards the magnet plate, the coil assembly is provided with compressible end stops at its side opposing the magnet plate. The coil assembly may stand on the end stops, when the planar motor is in rest. For performing the initialization method according to the present invention, the end stops are compressible, i.e. having a suitable stiffness for supporting the coil assembly when the planar motor is in rest and for being compressed due to an additional force such that a compression is detectable.

Such a compression of the end stops may be determined by determining a distance between the coil assembly and the magnet plate as described above. In an embodiment, the end stops may comprise a suitable sensor such as an electronic sensor, for example a capacitive or inductive sensor, the sensor being operatively coupled to the control system, for determining a compression of the end stops directly.

In a further embodiment, the present invention provides a lithographic apparatus comprising an illumination system that conditions a beam of radiation; a support structure configured to support a patterning device that imparts a desired pattern to the beam of radiation; a substrate holder configured to hold a substrate; a projection system configured to project the patterned beam onto a target portion of the substrate; and a planar motor system to position the substrate or the patterning device. The planar motor system comprising at least one coil assembly provided with a plurality of coils and a magnet plate provided with a plurality of magnets; and a control system that controls a current supplied to the coils of the coil assembly. The control system is configured to supply a control current, to vary a commutation angle of the control current, to determine a displacement of the coil assembly based on the commutation angle, and to select the commutation angle that results in a maximum displacement as the commutation offset angle.

In another embodiment, the present invention provides a device manufacturing method comprising providing a substrate that is at least partially covered by a layer of radiation-sensitive material; conditioning a beam of radiation using a radiation system; configuring the beam of radiation with a desired pattern in its cross-section based on a patterning device; positioning the substrate or the patterning device using a planar motor system that contains at least one coil assembly provided with a plurality of coils and a magnet plate provided with a plurality of magnets; supplying a control current to the coils of the at least one coil assembly; varying a commutation angle of the control current; determining a displacement of the coil assembly relative to the magnet plate based on the commutation angle; selecting the commutation angle that results in a maximum or a minimum displacement; determining the commutation offset angle based on the selected commutation angle; and projecting the patterned beam of radiation onto a target portion of the substrate.

In the above description, it is presumed that the magnet plate is positioned horizontally and the coil assembly may move horizontally. However, in an embodiment the magnet plate may be otherwise oriented (e.g. vertically) and the coil assembly may move correspondingly.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5–20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

Patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Lithographic Apparatus

Figure 1:
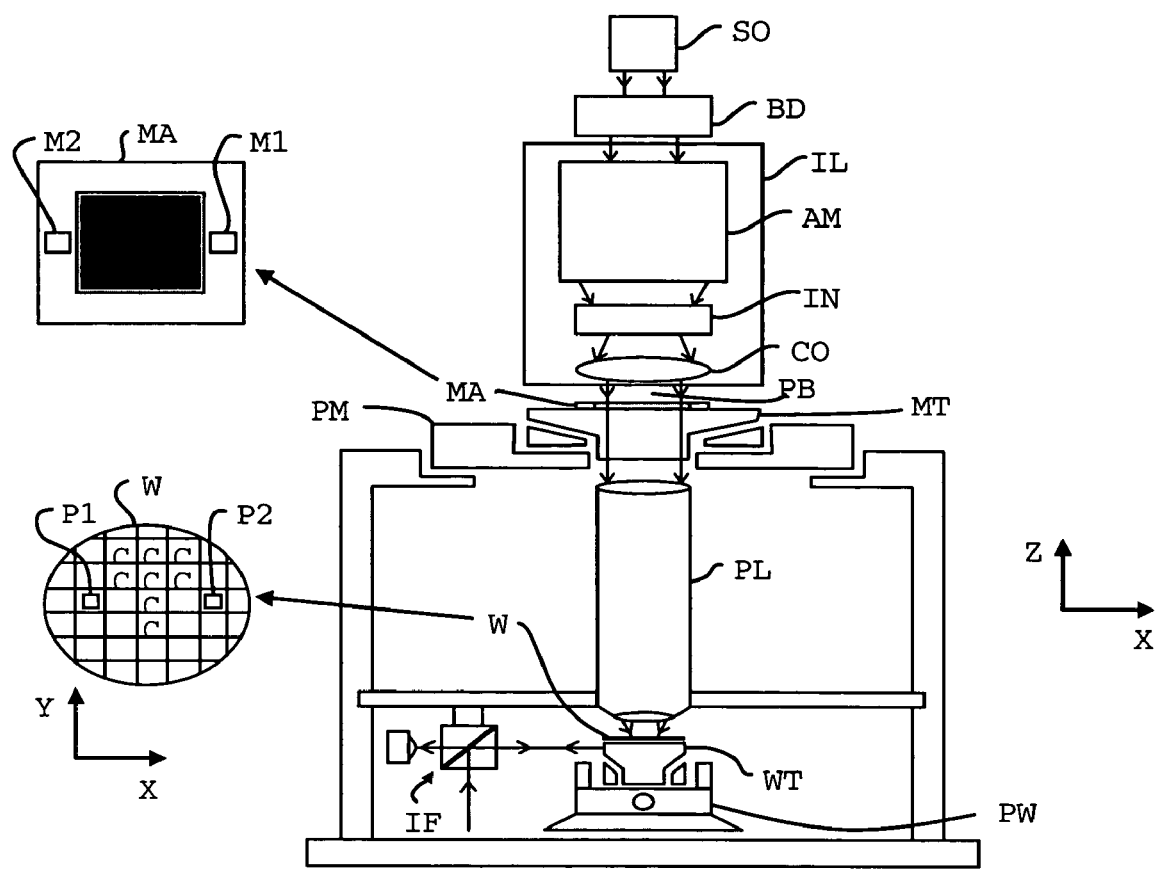
FIG. 1 depicts a lithographic apparatus according to an embodiment of the invention.

FIG. 1 schematically depicts a lithographic apparatus 1 according to an embodiment of the invention. The apparatus comprises:

The apparatus 1 comprises:

an illumination system (illuminator) IL: for providing a projection beam PB of radiation (e.g. UV or EUV radiation).

a first support structure (e.g. a mask table/holder) MT: for supporting patterning device (e.g. a mask) MA and coupled to first positioning mechanism PM for accurately positioning the patterning device with respect to item PL;

a substrate table (e.g. a wafer table/holder) WT: for holding a substrate (e.g. a resist-coated wafer) W and coupled to second positioning mechanism PW for accurately positioning the substrate with respect to item PL; and a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a reflective type (e.g. employing a reflective mask or a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:
step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.
scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.
other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
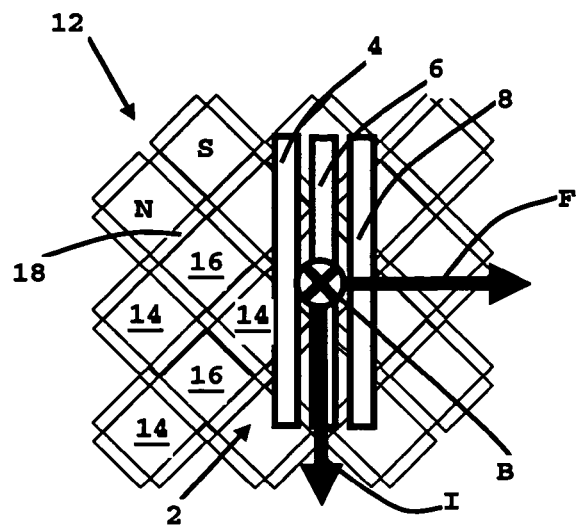
FIG. 2 schematically shows a top view of a planar motor.

FIG. 2 depicts a planar motor, in accordance with an embodiment of the present invention. The planar motor comprises a coil assembly 2 and a magnet plate 12. The coil assembly 2 comprises three elongated coils 4, 6 and 8, and the coils 4, 6 and 8 are positioned parallel to each other in the horizontal plane. The magnet plate 12 comprises a number of magnets 14, 16. The magnet plate 12 is substantially parallel to the plane of the coils 4, 6 and 8.

The magnet 14 has a magnetic pole N (north pole) at its side opposing the coil assembly 2, while the magnet 16 has a magnet pole S (south pole) at its side opposing the coil assembly 2. Thus, a checkerboard of alternating magnet poles N, S is provided at the side of the magnet plate 12 opposing the coil assembly 2.

Between the magnets 14, 16 of the magnet plate 12, additional magnets 18 may be provided to shape the generated magnetic field B. The shape of the magnetic field B determines a movement of the coil assembly 2 as will be explained hereinafter. It is known in the art that a sine wave shaped magnetic field B is preferred in order to obtain a smooth movement of the coil assembly 2.

When a current I flows through a coil 4, 6 and/or 8, a force F is generated. The force F is dependent on the local magnetic field B and the current I. The direction of the force F is perpendicular to both the magnetic field B and the current I. Since the direction of the magnetic field B varies over the surface of the magnet plate 12, the force F may be directed in any direction, i.e. vertically, horizontally or any other direction there between. It is noted that the force F is horizontally limited to a direction perpendicular to the elongated length of the coils 4, 6 and 8. Thus, in the illustrated embodiment, the coil assembly may move horizontally under the influence of the force F. A force directed vertically may compensate a force of gravity such that the coil assembly 2 hovers over the magnet plate 12 reducing or avoiding a friction force.

Providing the coils 4, 6 and 8 with separate currents having different phase angles, e.g. a three-phase alternating current, three separate forces are generated such that the coil assembly 2 may levitate due to a vertically generated force, and may be moved due to a horizontally generated force. During movement of the coil assembly parallel to the magnet plate, the different phase currents are altered (i.e. commutated) in order to keep the forces F in a desired direction for moving and supporting the coil assembly 2. A similar phase-related commutation is possible for a 2-coil or two-phase planar motor.

The commutation-offset angle is to be determined for the specific position of the coil assembly 2 relative to the magnet plate 12. Thereto, Hall sensors may be employed for determining the magnetic field directly, or a position determination system for determining the magnetic field indirectly, as known in the prior art. Without such sensors or such a system, the relative position must be determined during start up of the planar motor, since the relative position and therefore the commutation offset angle may be unknown at start up. During further operation of the planar motor, the determined commutation offset angle may be employed.

To move an object in a plane, i.e. in at least two directions, an object carrier 20 may be provided with at least two coil assemblies 2. Each coil assembly 2 may be controlled to move in one direction. For a stable and smooth operation of the planar motor, it is preferred to provide four coil assemblies 2 each containing 2 or 3 individual coils to move the object carrier 20 in two substantially perpendicular directions, as illustrated in FIG. 3.

To prevent a rotation of the object carrier 20, a rotation limiting system may be provided. Such a rotation limiting system may be for example a mechanical system. The rotation limiting system may be configured to keep the coil assembly 2 under an angle of substantially 45 degrees with respect to the checkerboard pattern of the magnet plate 12 as illustrated in FIG. 2.

Figure 3:
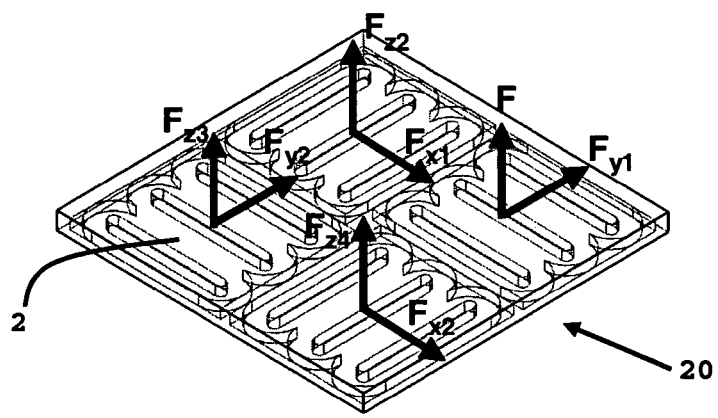
FIG. 3 schematically illustrates an actuator carrier comprising four coil assemblies.

FIG. 3 illustrates an object carrier 20, in accordance with an embodiment of the present invention. The object carrier 20 comprises two coil assemblies for generating a force Fx1, Fx2 in a x-direction, and two coil assemblies for generating a force Fy1, Fy2 in a y-direction. All four coil assemblies may further generate a force Fz1, Fz2, Fz3, Fz4 in a z-direction. The z-direction is directed vertically for compensating the force of gravity in order to support the object carrier 20 and an object positioned on the carrier, while hovering over the magnet plate.

Figure 4:
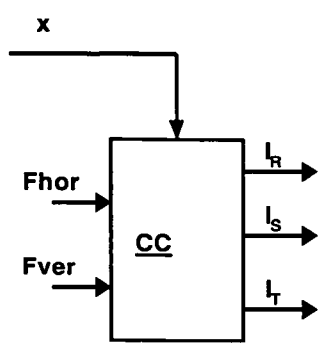
FIG. 4 shows a control scheme for controlling a planar motor.

FIG. 4 illustrates a control scheme for controlling the planar motor, in accordance with an embodiment of the present invention. The control scheme is based on providing three currents $I_R$, $I_S$, $I_T$ to three coils of a coil assembly. A control circuit CC receives from a position control system signals representing a desired horizontal force $F_{hor}$ and a desired vertical force $F_{ver}$.

Further, the control circuit CC receives a signal representing the actual position of the coil assembly relative to the magnet plate possibly also from the position control system. The control circuit outputs the currents $I_R$, $I_S$, $I_T$ having a phase corresponding to the desired commutation. The currents $I_R$, $I_S$, $I_T$ may be calculated using the formulas:

$$I_R = \sqrt{F_{hor}^2 + F_{ver}^2} * \arctan\left(\frac{F_{ver}}{F_{hor}} + \pi\frac{x}{\tau} + \varphi_0\right)$$

$$I_S = \sqrt{F_{hor}^2 + F_{ver}^2} * \arctan\left(\frac{F_{ver}}{F_{hor}} + \pi\frac{x}{\tau} + \varphi_0 + \frac{2}{3}\pi\right)$$

$$I_T = \sqrt{F_{hor}^2 + F_{ver}^2} * \arctan\left(\frac{F_{ver}}{F_{hor}} + \pi\frac{x}{\tau} + \varphi_0 + \frac{4}{3}\pi\right)$$

wherein x is the position relative to the magnet plate, $\tau$ is the pitch between the magnetic poles of the magnet plate, and $\varphi_0$ is the commutation-offset angle.

For a two-phase commutated system, the relationship of commutation angle and coil currents Ia and Ib can be described by:

$$I_a = \sqrt{F_{hor}^2 + F_{ver}^2} * \arctan\left(\frac{F_{ver}}{F_{hor}} + \pi\frac{x}{\tau} + \varphi_0\right)$$

$$I_b = \sqrt{F_{hor}^2 + F_{ver}^2} * \arctan\left(\frac{F_{ver}}{F_{hor}} + \pi\frac{x}{\tau} + \varphi_0 + \frac{1}{2}\pi\right)$$

At start-up, if the position relative to the magnet plate is unknown, the relative position x may be assumed zero. However, the commutation-offset angle needs to be adapted to the actual position with respect to the magnetic field. Thereto, the present invention provides an initialization method, which does not require a magnetic field sensing system, such as Hall sensors, or an absolute position measurement system.

Figure 5A:
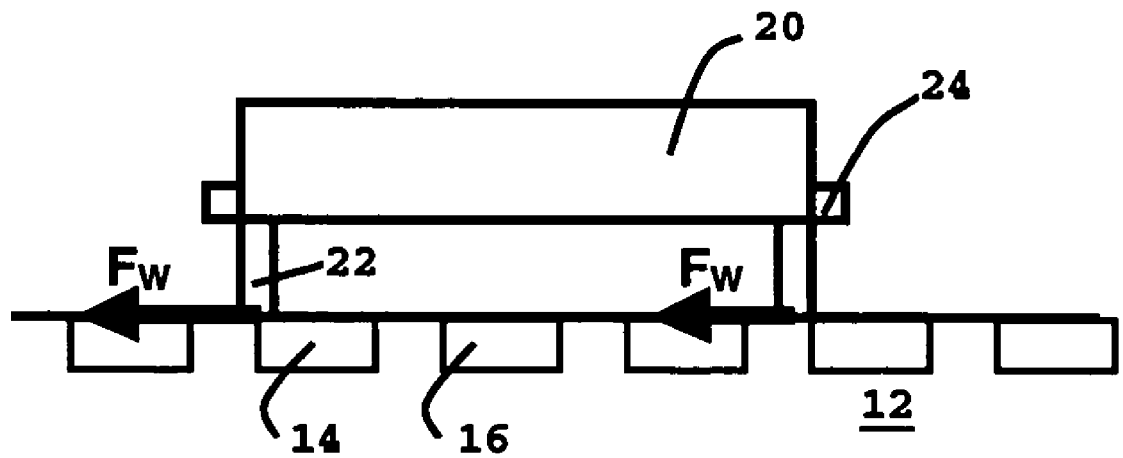
FIGS. 5A and 5B schematically each show a side view of a planar motor according to the present invention.

FIG. 5A shows an object carrier 20 provided with one or more coil assemblies of a planar motor, in accordance with an embodiment of the present invention. The object carrier 20 levitates over a magnet plate 12 comprising alternating magnets 14, 16 (see also FIG. 2). The planar motor is not in operation. The object carrier 20, provided with end stops 22, is standing on the magnet plate 12. The object carrier 20 is further provided with at least one distance sensor 24 for controlling the distance between the magnet plate 12 and the object carrier 20 during operation. Such a distance sensor 24 is not essential for operating the planar motor. However, if the carrier 20 may carry different objects with an unknown mass, the distance sensor 24 is preferred for controlling the vertical force to be generated for compensating the force of gravity on the carrier 20 and the object thereon.

While the object carrier 20 is positioned on the magnet plate 12, a horizontal friction force $F_W$ is to be overcome before the object carrier 20 may move over the magnet plate 12. Thus, if a horizontal force is generated by a coil assembly and if that generated horizontal force does not exceed the friction force $F_W$, the object carrier 20 will not move. Moreover, if a vertical force is generated upwardly, the object carrier 20 will not move as long as the vertical force does not exceed the force of gravity. Further, if a vertical force is generated downwardly, the object carrier 20 is pressed against the magnet plate 12 and therefore the object carrier 20 does not move. Thus, if a force in an unknown direction is generated, which force does not exceed the friction force $F_W$ and does not exceed the force of gravity (which generally exceeds the friction force $F_W$), the object carrier 20 will not move. However, if the generated force is directed at least partially vertically, the pressure of the object carrier end stops 22 on the magnet plate 12 changes.

When the commutation-offset angle is to be determined at start-up, a force may be generated, while the direction of the force is unknown, as the commutation is unknown. However, the strength of the force is known, because the strength is derivable from the amount of current flowing through the coil assembly. By varying the commutation-angle while inputting the above-mentioned three currents in the coil assembly, the direction of the generated force varies. When the force is directed vertically, the pressure of the end stops 22 on the magnet plate 12 is at a maximum, if the force is directed towards the magnet plate 12, or a minimum, when the force is directed away from the magnet plate 12. In either case, the commutation-offset angle may be determined from the commutation angle used for generating the vertical force.

To determine the pressure on the end stops 22, the end stops 22 may be provided with a pressure sensor. Also, in another embodiment, the end stops 22 may be compressible and the end stops 22 may be provided with sensors for detecting the compression of the end stops 22. In the embodiment illustrated in FIG. 5A, the end stops 22 are compressible and distance sensors 24 determine a distance between the object carrier 20 and the magnet plate 12. The end stops 22 will be compressed due to a generated vertical force directed towards the magnet plate 12. If the force is directed away from the magnet plate 12, the compression of the end stops 22 may become less, since the end stops 22 may already be compressed due to the force of gravity. A minimum distance or a maximum distance between the object carrier 20 and the magnet plate 12 indicates that the generated force is directed vertically towards or away from the magnet plate 12, respectively. Thus, the present invention provides a method for determining when a generated force is directed vertically. The commutation angle resulting in a force directed vertically towards the magnet plate 12 may be employed as the commutation offset angle.

Figure 5B:
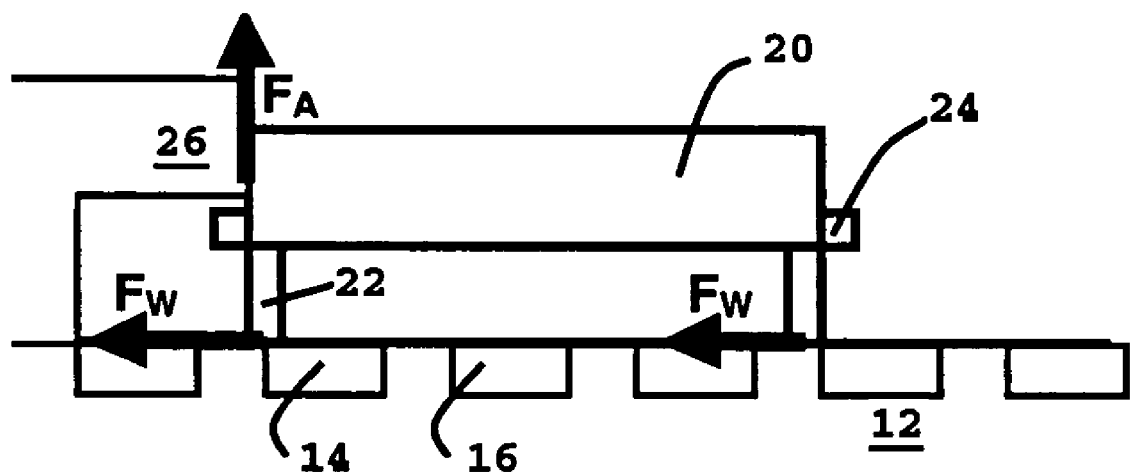

A further embodiment of the present invention is illustrated in FIG. 5B. In FIG. 5B the object carrier 20 is at rest, i.e. not in operation, and is supported by the magnet plate 12 similar to the case illustrated in FIG. 5A. In FIG. 5B, however, the object carrier 20 is positioned against a side wall 26 of the planar motor. The side wall 26 may be provided around the magnet plate 12 to prevent that the object carrier 20 escapes from the magnetic field generated by the magnet plate 12. In this case, there is not only a horizontal friction force $F_W$ between the end stops 22 and the magnet plate 12, there is also a vertical friction force $F_A$ between the object carrier 20 and the side wall 26.

The initialization method according to the present invention may still be employed under certain conditions. If the generated force exceeds the vertical friction force $F_A$, the object carrier 20 may move vertically due to the generated force, when it is directed vertically. Further, the generated force should not exceed the horizontal friction force $F_W$, and therefore the vertical friction force $F_A$ should not exceed the horizontal friction force $F_W$. Thus, it is possible to perform the initialization method when the object carrier 20 is positioned against the side wall 26.

If the vertical friction force $F_A$ exceeds the horizontal friction force $F_W$, the initialization method may not be performed as described above. However, simple measures may ensure that the horizontal friction force $F_W$ does exceed the vertical friction force $F_A$. For example, the end stops 22 may be composed of a material generating a high friction force, or the object carrier 20 and/or side wall 26 may be covered with a material generating a low friction force.

The commutation-offset angle determined according to the method described in relation to FIGS. 5A and 5B is determined with a certain accuracy. The accuracy is limited due to the fact that the generated force may not exceed the horizontal friction force $F_W$ to prevent that the object carrier 20 shifts over the magnet plate 12, thereby possibly damaging the end stops 22 and the magnet plate 12. However, when a commutation-offset angle is determined with a limited accuracy, the method may be performed again using a force exceeding the horizontal friction force $F_W$, while ensuring that the generated force will not be directed horizontally. Varying the commutation-offset angle in a limited interval around the previously determined commutation-offset angle ensures that the generated force will not be directed horizontally. By using a stronger force the pressure or compression of the end stops 22 is larger, and therefore the commutation-offset angle may be determined with a higher accuracy.

The above method for increasing the accuracy may of course be embedded in the initialization method according to the present invention. For example, a commonly used position control system comprising a PID control circuit and a position feedback circuit may control the coil assembly to move towards the magnet plate by setting a position below the magnet plate, while the generated force is limited in order not to exceed the friction force. When the coil assembly has substantially moved towards the magnet plate, the limitation on the generated force may be removed gradually or substantially instantaneously, thereby enabling the position control system to generate a larger force resulting in a higher accuracy as described above.

It is noted that the initialization method according to the present invention is preferably performed for each coil assembly comprised in an object carrier of the planar motor. For example, the object carrier illustrated in FIG. 3 comprises four coil assemblies, and therefore the initialization method may be performed four times. In such an embodiment, when one of the four coil assemblies generates a vertical force, a tilting moment may be generated on the object carrier resulting in a displacement in the direction of the force, but also in a tilting rotation. However, in the initialization method according to the present invention, only a maximum (pressure or displacement) or a minimum (distance between the magnet plate and the coil assembly) is to be determined. Therefore, although the tilting rotation may influence the absolute value of the pressure, the displacement or the distance, the rotation does not substantially influence the commutation angle resulting in a maximum or minimum and therefore does not substantially influence the result of the initialization method.

It should be noted that the commutation angle may be found by a closed loop position control of the planar motor, the control input being one or more position sensors and the controller output being the magnitude and phase angle of the current in one of the coils.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. An initialization method of determining a commutation offset angle for a planar motor, the planar motor comprising at least one coil assembly provided with a plurality of coils and a magnet plate provided with a plurality of magnets, said initialization method comprising:

supplying a control current to the coils of said at least one coil assembly;

varying a commutation angle of said control current;

determining a displacement of said coil assembly relative to said magnet plate as a function of said commutation angle;

selecting the commutation angle that results in a maximum and/or a minimum displacement; and determining the commutation offset angle based on said selected commutation angle.

2. The planar motor initialization method of claim 1, wherein the displacement of the coil assembly is substantially perpendicular to said magnet plate.

3. The planar motor initialization method of claim 1, wherein a generated force is predetermined in order not to exceed a friction force between said magnet plate and said coil assembly.

4. The planar motor initialization method of claim 3, further comprising:

increasing the control current using the determined commutation offset angle;

varying the commutation angle within a predetermined range;

determining a displacement of said coil assembly based on said commutation angle; and selecting the commutation angle that results in a maximum displacement as the commutation offset angle.

5. A planar motor system, comprising:
a planar motor comprising at least one coil assembly provided with a plurality of coils and a magnet plate provided with a plurality of magnets; and
a control system that controls a current supplied to the coils of said coil assembly,
wherein said control system is configured to supply a control current, to vary a commutation angle of said control current, to determine a displacement of said coil assembly based on said commutation angle, and to select the commutation angle that results in a maximum displacement as the commutation offset angle.

6. The planar motor system of claim 5, further comprising at least one distance sensor operatively coupled to said control system to determine a distance between said coil assembly and said magnet plate.

7. The planar motor system of claim 5, wherein the coil assembly is provided with compressible end stops at its side opposite to said magnet plate.

8. The planar motor system of claim 7, wherein said end stops comprise a sensor operatively coupled to said control system to determine a compression of the end stops.

9. A lithographic apparatus, comprising:
an illumination system that conditions a beam of radiation;
a support structure configured to support a patterning device that imparts a desired pattern to the beam of radiation;
a substrate holder configured to hold a substrate;
a projection system configured to project the patterned beam onto a target portion of the substrate; and
a planar motor system to position said substrate or said patterning device, said planar motor system comprising:
at least one coil assembly provided with a plurality of coils and a magnet plate provided with a plurality of magnets; and
a control system that controls a current supplied to the coils of said coil assembly,
wherein said control system is configured to supply a control current, to vary a commutation angle of said control current, to determine a displacement of said coil assembly based on said commutation angle, and to select the commutation angle that results in a maximum displacement as the commutation offset angle.

10. A device manufacturing method, comprising:
providing a substrate that is at least partially covered by a layer of radiation-sensitive material;
configuring a beam of radiation with a desired pattern in its cross-section based on a patterning device;
positioning the substrate or the patterning device using a planar motor system that contains at least one coil assembly provided with a plurality of coils and a magnet plate provided with a plurality of magnets;
supplying a control current to the coils of said at least one coil assembly;
varying a commutation angle of said control current;
determining a displacement of said coil assembly relative to said magnet plate based on said commutation angle;
selecting the commutation angle that results in a maximum or a minimum displacement;
determining the commutation offset angle based on said selected commutation angle; and
projecting the patterned beam of radiation onto a target portion of the substrate.

* * * * *